United States Patent
Wang et al.

(10) Patent No.: US 10,177,872 B1
(45) Date of Patent: Jan. 8, 2019

(54) ORTHOGONALLY POLARIZED VCSELS

(71) Applicant: HEWLETT PACKARD ENTERPRISE DEVELOPMENT LP, Houston, TX (US)

(72) Inventors: Binhao Wang, Palo Alto, CA (US); Wayne Victor Sorin, Palo Alto, CA (US); Michael Renne Ty Tan, Palo Alto, CA (US); Sagi Mathai, Palo Alto, CA (US); Stanley Cheung, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/714,266

(22) Filed: Sep. 25, 2017

(51) Int. Cl.
| | |
|---|---|
| *G11B 7/1356* | (2012.01) |
| *G11B 7/127* | (2012.01) |
| *H04J 14/06* | (2006.01) |
| *H04B 10/50* | (2013.01) |
| *H04B 10/69* | (2013.01) |
| *G02B 27/30* | (2006.01) |
| *G02B 6/42* | (2006.01) |
| *H01S 5/022* | (2006.01) |

(Continued)

(52) U.S. Cl.
CPC ............ *H04J 14/06* (2013.01); *G02B 6/4206* (2013.01); *G02B 27/30* (2013.01); *H04B 10/503* (2013.01); *H04B 10/6911* (2013.01); *H01S 5/02236* (2013.01); *H01S 5/183* (2013.01); *H01S 5/423* (2013.01); *H04B 7/0456* (2013.01)

(58) Field of Classification Search
CPC .................. G11B 7/127; G11B 7/1205; G11B 2007/0006; G11B 7/1356; G11B 7/1365; G11B 7/125; G11B 7/1275; G11B 7/128

USPC ................. 369/120, 121, 122, 44.37, 110.04
See application file for complete search history.

(56) References Cited

U.S. PATENT DOCUMENTS

| | | |
|---|---|---|
| 6,275,317 B1 | 8/2001 | Doerr et al. |
| 6,879,442 B2 | 4/2005 | Pezeshki |
| (Continued) | | |

FOREIGN PATENT DOCUMENTS

| | | |
|---|---|---|
| EP | 1309051 A1 | 5/2003 |
| WO | WO-2014130386 A1 | 8/2014 |
| WO | WO-2015161488 A1 | 10/2015 |

OTHER PUBLICATIONS

Related Application, U.S. Appl. No. 15/688,448, Orthoganolly Polarized VCSELS, filed Aug. 28, 2017, 27 pages.

(Continued)

*Primary Examiner* — Nabil Z Hindi
(74) *Attorney, Agent, or Firm* — Hewlett Packard Enterprise Patent Department

(57) ABSTRACT

An example system may include a first vertical cavity surface emitting laser (VCSEL) that includes a first integrated polarization locking structure to produce a polarized optical data signal. The system may also comprise a second VCSEL that includes a second integrated polarization locking structure, the second integrated polarization locking structure orthogonal to the first integrated polarization locking structure, to produce an orthogonally polarized optical data signal. Lenses may be disposed on the substrate opposite the first VCSEL, to collimate the polarized optical data signal, and opposite the second VCSEL to collimate the orthogonally polarized optical data signal. A polarization division multiplexer may combine the first collimated polarized optical data signal and the second collimated orthogonally polarized optical data signal.

21 Claims, 7 Drawing Sheets

(51) Int. Cl.
*H04B 7/0456* (2017.01)
*H01S 5/42* (2006.01)
*H01S 5/183* (2006.01)

(56) References Cited

U.S. PATENT DOCUMENTS

| | | |
|---|---|---|
| 7,181,146 B1 | 2/2007 | Yorks |
| 8,526,471 B2 | 9/2013 | Chang-Hasnain et al. |
| 8,599,897 B2 | 12/2013 | Cox et al. |
| 8,725,001 B2 | 5/2014 | Fini et al. |
| 9,136,673 B2 | 9/2015 | Holder et al. |
| 9,157,790 B2 | 10/2015 | Shpunt et al. |
| 9,696,471 B2 | 7/2017 | Flanders et al. |
| 2014/0353530 A1 | 12/2014 | Chang-Hasnain et al. |

OTHER PUBLICATIONS

Chang-Hasnain, C. et al., "High-Contrast Gratings for Integrated Optoelectronics," (Research Paper), Advances in Optics and Photonics 4.3, Sep. 30, 2012, pp. 379-440, https://pdfs.semanticscholar.org/a330/60345d3d9ea8d80b9a735aa57809281eab8e.pdf.

Kuksenkov, D.V. et al., "Polarization Instability and Mode Partition Noise in Vertical-cavity Surface-emitting Lasers," (Research Paper), Jun. 1998, 4 pages, http://aip.scitation.org/doi/10.1063/1.114746.

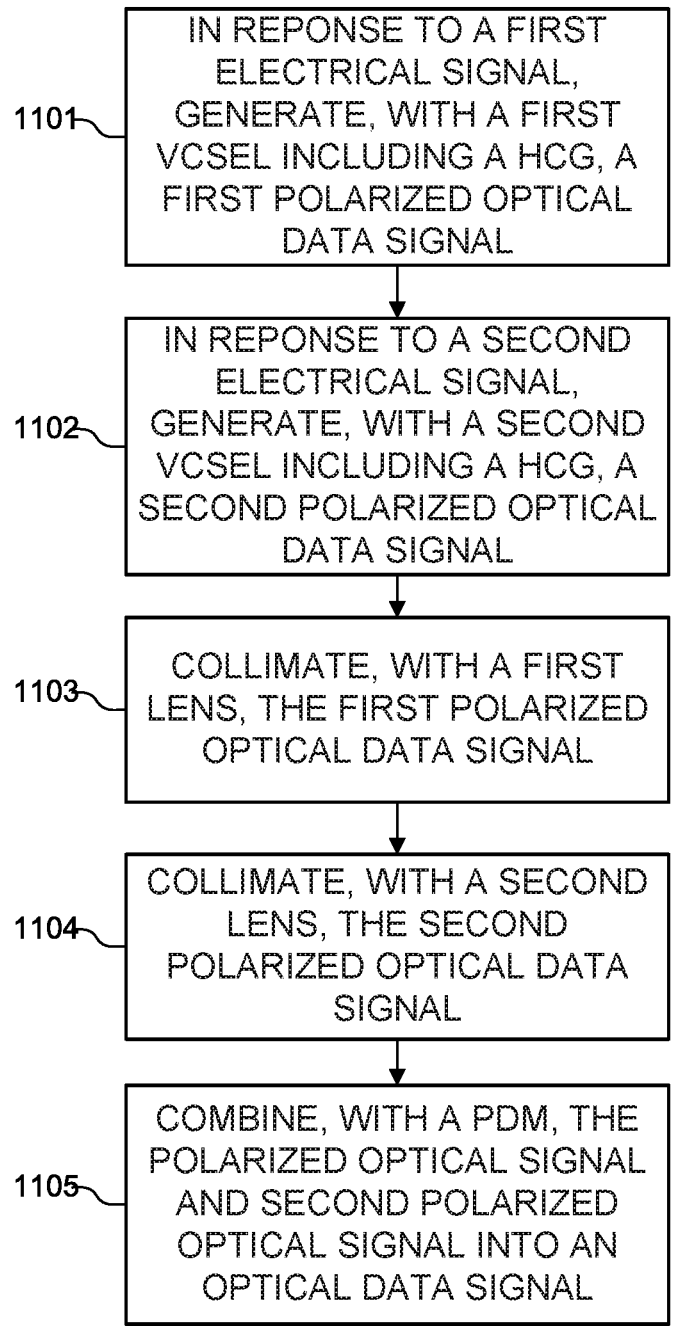
FIG. 11          1100

ORTHOGONALLY POLARIZED VCSELS

BACKGROUND

Optical transceivers transmit and receive optical data signals over a fiber. Optical transceivers may use vertical-cavity surface-emitting lasers (VCSELs) to generate the optical data signals transmitted over the fiber. Such optical data signals may be combined using various multiplexing methods to increase data transmission bandwidth.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

FIG. 11 is a flowchart of an example method of VCSELs generating orthogonally polarized optical data signals.

DETAILED DESCRIPTION

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Optical transceivers transmit and receive optical data signals over a fiber. Optical transceivers may use vertical-cavity surface-emitting lasers (VCSELs) to generate the optical data signals transmitted over the fiber. Such optical data signals may be combined using various multiplexing methods to increase data transmission bandwidth.

Examples described herein may utilize a pair of VCSELs, each with an integrated polarization locking structure. The polarization locking structure of one VCSEL may be orthogonal to the polarization locking structure of the other VCSEL, to produce a pair of orthogonally polarized optical data signals. A polarization division multiplexer (PDM) may combine the polarized optical data signal and orthogonally polarized optical data signal. A lens may focus the combined optical data signal onto a fiber for transmission to a receiver. Such examples may increase the signal density per fiber by several times, depending on the amount of VCSELs utilized and whether wavelength division multiplexer (WDM) is utilized. Using WDM allows combination of optical data signals of multiple pairs of orthogonally polarized VCSELs of varying wavelengths. Other forms of multiplexing may be utilized, further increasing bandwidth.

Figure 1:
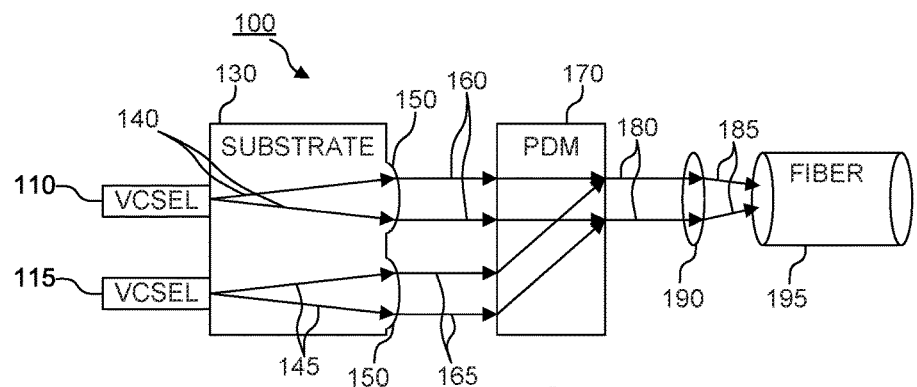
FIG. 1 is a block diagram of an example system including two orthogonally polarized vertical-cavity surface-emitting lasers (VCSELs) with integrated lenses, a polarization division multiplexer (PDM), and a lens to focus an optical data signal onto a fiber.

FIG. 1 is a block diagram of an example system 100 including two orthogonally polarized VCSELs 110, 115 with integrated lenses 150, a PDM 170, and a lens 190 to focus an optical data signal 180 onto a fiber 195. In FIG. 1, the system 100 may comprise a first VCSEL 110. The first VCSEL 110 may include a first integrated polarization locking structure. The first VCSEL 110, when modulated by an electrical signal, may produce a polarized optical data signal 140. The system 100 may also comprise a second VCSEL 115. The second VCSEL 115 may include a second integrated polarization locking structure. The second integrated polarization locking structure may be orthogonal to the first polarization locking structure. Thus, the second VCSEL 115 may produce an orthogonally polarized optical data signal 145. The wavelength of the polarized optical data signal 140 and the orthogonal polarized optical data signal 145 may be different. The system 100 may also comprise lenses 150 disposed opposite each VCSEL 110, 115. The lenses 150 collimate the optical data signals 140, 145. The system 100 may also include a PDM 170. The PDM 170 may combine the collimated polarized optical data signal 160 and the collimated orthogonally polarized optical data signal 165.

As described above the PDM 170 may combine the collimated polarized optical data signal 160 and the collimated orthogonally polarized optical data signal 165. A lens 190 may focus the resulting combined optical data signal 180 onto a fiber 195. In another example, another type of multiplexing may combine more optical data signals before transmission over a fiber 190. In system 100, the VCSELs 110, 115 are disposed on the same substrate 130. Further, the VCSELs 110, 115 may be closely disposed on the substrate 130. In another example, the VCSELs 110, 115 are disposed on separate substrates.

As described above, the function of the PDM 170 is to combine two polarized signals. In system 100, the PDM 170 combines two collimated orthogonally polarized optical data signals 160, 165. Thus, the PDM 170 combines optical data signals 140 and 145, which are polarized and orthogonal to each other, to produce a combined optical data signal 180 of a certain wavelength. In an example, the PDM may be a polarization walk-off crystal. Further, the crystal may be a rutile. Accordingly, a polarization division demultiplexer (PDD) may separate an optical data signal into two orthogonally polarized optical data signals. However the two orthogonally polarized optical data signals, at that point in time, may be rotated due to the behavior of optical data signals transmitted over a fiber. In an example, a multiple-in multiple-out (MIMO) matrix may correct the optical data signal rotation.

Similarly, a WDM may combine optical data signals of varying wavelengths. There are various types of WDMs that may be utilized. In an example, a coarse WDM (CWDM) may combine the optical data signals to be transmitted over a fiber. For a CWDM, the optical data signals may vary between 20-30 nanometers. Further, a CWDM may combine up to 18 optical data signals. In another example, a dense WDM (DWDM) or ultra-dense WDM (UDWDM) may combine the optical data signals to transmit over a fiber. The variations of wavelength in DWDM or UDWDM are smaller, allowing for smaller tolerances. The difference between the various methods is the amount of optical data signals combined and the tolerance in wavelength allowable for each optical data signal. In an example, the WDM may be a prism or a zig-zag cavity with WDM filters. Similarly, the wavelength division demultiplexer (WDD) separates the combined optical data signal into separate optical data signals of varying wavelengths.

As described above, each VCSEL 110, 115 may include an integrated polarization locking structure. In an example, the integrated polarization locking structure may be standard gratings, shallow etched grooves, low index contrast gratings, or metal reflecting lines. In another example, the integrated polarization locking structure may be lines in the metal contact of the VCSEL 110, 115. In such examples, the lines in the metal contact of the VCSEL 110, 115 may cause one optical data signal to experience more loss than another paired VCSEL 110, 115, thus creating polarized optical data signals. In another example, the integrated polarization locking structure is an integrated high contrast grating (HCG). In such examples, the first VCSEL 110 may include a first integrated HCG. The HCG of the first VCSEL 110 may comprise a first pattern of grating. Thus, the first VCSEL 110, when modulated by an electrical signal, may produce a polarized optical data signal 140. The second VCSEL 115 may include a second integrated HCG. The second integrated HCG of the second VCSEL 115 may comprise a second pattern of grating. The second pattern of grating may be orthogonal to the first pattern of grating. Thus, the second VCSEL 115 may produce an orthogonally polarized optical data signal 145.

The integrated HCG may be a series of bars spaced at equal periods. The period of the bars may be at or near the wavelength of the optical data signal produced by the VCSELs 110, 115. The integrated HCG may be a single layer. The bars of the integrated HCG may be composed of a variety of different materials. The material may have a high index of refraction. The integrated HCG may be disposed over the VCSEL 110, 115 in such a way that the optical data signal produced by the VCSEL 110, 115 may pass through the integrated HCG. In an example the HCG may be fixed. In such examples, the HCG may lock the polarization of the VCSELs 110, 115 optical data signals.

In this example, the substrate 130 may be any number of materials used for VCSELs 110, 115 and photodetectors. In an example, the VCSELs 110, 115 may be disposed on a substrate 130 formed from gallium arsenide. In another example, the photodetectors may be disposed on a substrate formed from indium phosphide. The VCSELs 110,115 and photodetectors may be composed of and disposed on other substrates formed from other materials.

Figure 2:
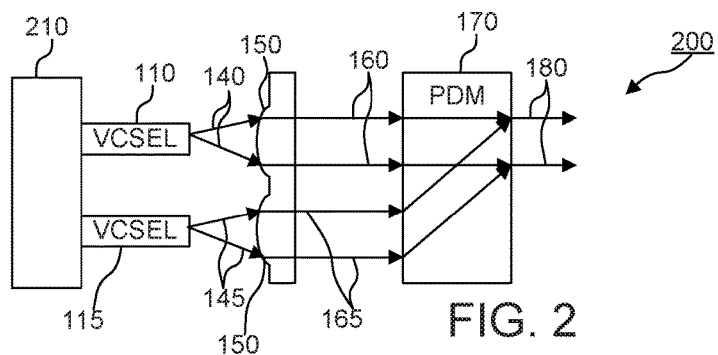
FIG. 2 is a block diagram of an example system including two orthogonally polarized vertical-cavity surface-emitting lasers (VCSELs), discrete lenses, and a PDM.

FIG. 2 is a block diagram of an example system 200 including two orthogonally polarized VCSELs 110, 115, discrete lenses 150, and a PDM 160. In system 200, the lenses 150 may not be integrated with the VCSELs 110, 115. In such examples, the lenses 150 are discrete and separate from each VCSEL 110, 115. As described above, the lenses 150 collimate the orthogonally polarized optical data signals 140, 145 of the orthogonally polarized VCSELs 110, 115. After passing through the lenses 150, the collimated orthogonally polarized optical data signals 160, 165 may proceed to a PDM 170. In another example, other optical data signals of varying aspects may proceed to other types of multiplexers, for example time division multiplexing. In an example, the VCSELs 110, 115 are disposed on the same substrate 210. In another example, the VCSELs 110, 115 may be disposed on separate substrates. The VCSELs 110, 115 may be spaced at a distance equal to 65 microns or less than 250 microns. In an example, the fiber comprises a fiber array. The pitch between each fiber may equal 250 microns. Further, the distance between each VCSEL 110, 115 may be determined based on the fiber pitch and amount of VCSELs 110, 115 in a system 200.

Figure 3:
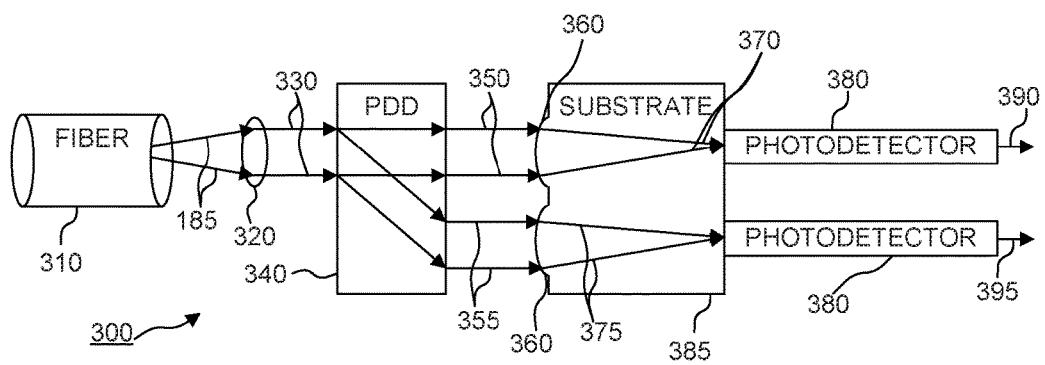
FIG. 3 is a block diagram of an example receiver including a lens to collimate the output of a fiber, a polarization division demultiplexer (PDD), and lenses to focus optical data signals onto a photodetector.

FIG. 3 is a block diagram of an example receiver 300 including a lens 320 to collimate the output optical data signal 185 of a fiber 310, a PDD 340, and lenses 360 to focus optical data signals 350, 355 onto a photodetector 380. FIG. 3 illustrates a fiber 310 transferring an optical data signal 185 to a receiver 300. System 100, system 200, or another similar system may transfer the optical data signal 185 over a fiber 310 to a receiver 300. The lens 320 of the receiver 300 may collimate the optical data signal 185. The collimated optical data signal 330 is sent to a PDD 340. The PDD 340, as described above, separates the collimated optical data signal 330 into a polarized optical data signal 350 and an orthogonally polarized optical data signal 355. Lenses 360, disposed on a substrate 385 opposite photodetectors 380, focus the orthogonally polarized optical data signals 350, 355 onto the photodetectors 380. The photodetectors 380 may convert the focused orthogonally polarized optical data signals 370, 375 to electrical signals 390, 395. In another example, the photodetectors 380 may be photodiodes.

Figures 4A, 4B:
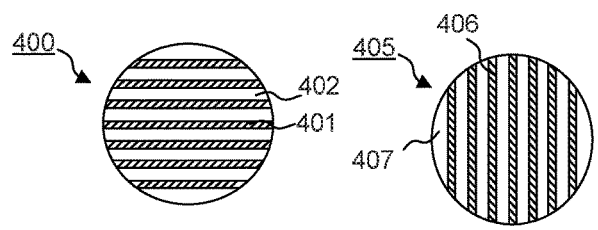
FIGS. 4A and 4B are block diagrams of examples of high contrast grating.

FIGS. 4A and 4B are block diagrams of examples of high contrast grating 400, 405. As noted above, the VCSELs 110, 115 include an integrated HCG 400, 405 with a pattern of grating. The gratings 402, 407 may be spaced at equal distances. The VCSELs 110, 115, as noted above, produce optical data signals. The optical data signals pass through the openings 401, 406 of the pattern of grating. The pattern of grating may create the polarization of the optical data signal. As illustrated in FIG. 4A and FIG. 4B, one VCSEL, for example VCSEL 110, may include HCG 400 with a pattern of grating, while VCSEL 115 may include an HCG 405 with an orthogonal pattern of grating. The orthogonal pattern of grating creates the orthogonally polarized optical data signal. In an example, a first pattern of grating may be in any direction or orientation (such as varying degrees of diagonal directions) while a second pattern of grating may be orthogonal to the direction of the first pattern of grating.

As noted above, the wavelength of the polarized optical data signal 140 and the wavelength of the orthogonally polarized optical data signal 145 may be different. In such examples, the wavelength of each orthogonally polarized optical data signals 140, 145 may be different by less than or equal to 0.3 nanometers. The wavelength of the orthogonally polarized optical data signals 140, 145 may be different to prevent optical data signal beating within the receiver bandwidth. Stated another way, to prevent the inclusion of a beat frequency. In another example, the wavelength of each orthogonally polarized optical data signal 140, 145 is the same.

In another example, the integrated polarization locking structure may include grating. The grating used for one VCSEL may vary in comparison to the grating of a second paired VCSEL, in an aspect other than orthogonality. Small variations in grating, for example a small increase in the thickness or width of the grating, may alter the wavelength of an optical data signal. In another example, the pattern of grating of the HCG 400, 405 may alter the wavelength of the orthogonally polarized optical data signals 140,145. Adjusting the period, pitch, or thickness of the pattern of grating may alter the wavelength of the orthogonally polarized optical data signals 140, 145.

Figure 5:
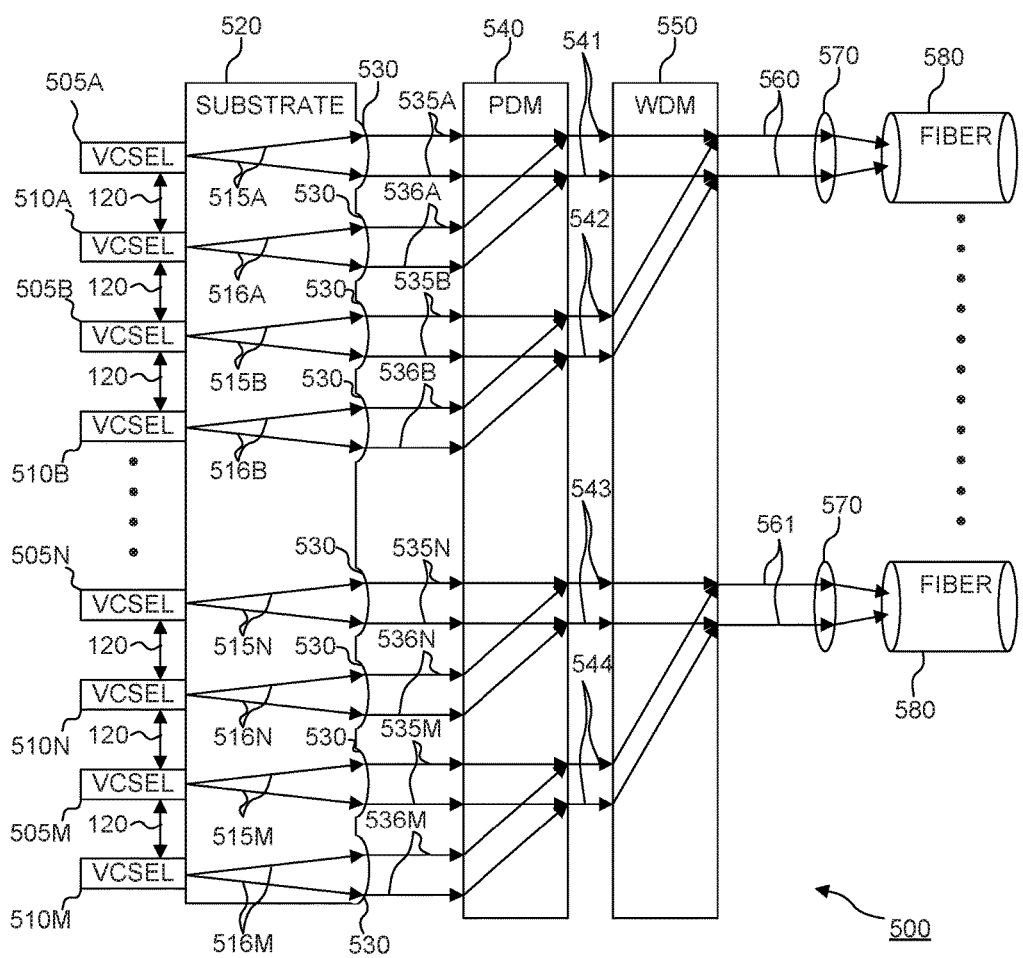
FIG. 5 is a block diagram of an example of an array of VCSELs, with a PDM, and a wavelength division multiplexer (WDM)

FIG. 5 is a block diagram of an example of an array of VCSELs 505, 510, with a PDM 540, and a WDM 550. FIG. 5 illustrates an array of VCSELs 505, 510. Each VCSEL 505 may pair, in terms of polarization of the optical data signal produced, with the adjacent VCSEL 510. For example VCSEL 505A produces a polarized optical data signal 515A and VCSEL 510A produces an orthogonally polarized optical data signal 516A. VCSEL 505A and VCSEL 510A produce orthogonally polarized optical data signals 515A, 516A. As described above, the optical data signals 515, 516 may vary in wavelength (for example, by less than or equal to 0.3 nanometers). Each pair of VCSELs 505, 510 produces orthogonally polarized optical data signals 515, 516 of varying wavelengths different than adjacent pairs of VCSELs 505, 510. For instance, VCSELs 505A and 510A may produce orthogonally polarized optical data signals 515A, 516A with wavelengths of close to 1065 nanometers. Further VCSELs 505B and 510B may produce orthogonally polarized optical data signals 515B, 516B with wavelengths of close to 1040 nanometers. In a further example, if VCSELS 505N and 510N are adjacent to VCSELs 505B and 510B, then VCSELs 505N and 510N may produce orthogonally polarized optical data signals 515N, 516N with wavelengths of close to 1015 nanometers. Further, VCSELs 505M and 510M may produce orthogonally polarized signals 515M, 516M with wavelengths of close to 990 nanometers. The wavelengths may be various other sizes.

In another example, integrated lenses 530 may collimate the optical data signals 515, 516 produced by the VCSELs 505, 510. In another example, the lenses 530 may be discrete and not integrated with the VCSELs 505, 510. In another example, the collimated optical data signals 535, 536 may be sent to a PDM 540. Each pair of collimated orthogonally polarized optical data signals 535, 536 may combine in the PDM 540 to form optical data signals 541, 542, 543, 544 of varying wavelengths. The optical data signals 541, 542, 543, 544 of varying wavelengths may be sent to a WDM 550 at this point. The WDM 550 may combine any number of optical data signals 541, 542, 543, 544 of varying wavelengths. FIG. 5 illustrates the combination of two optical data signals (for example the combination of optical data signals 541 and 542 and the combination of optical data signals 543 and 544) in the WDM 550. In another example, the WDM 550 may combine N, where N may be greater than two, optical data signals. A lens 570 may focus the resulting optical data signal 560, 561 onto a fiber 580 for transmission to a receiver.

As noted above, the PDM 540 and WDM 550 combine optical data signals. As noted, the drawings may not be to scale and may actually be in another orientation that what is actually pictured. The VCSELs 505, 510 generate optical data signals 515, 516. The optical data signals 515, 516 may travel in a z direction. When the PDM 540 combines the orthogonally polarized optical data signals 515, 516, the combination may occur in the x and z plane. When the WDM 550 combines optical data signals 541, 542, 543, 544 of varying wavelengths are combined, the combination may occur in the y and z plane. The combinations described above may occur in other planes or directions. The figures are merely meant to represent the physical action of the combination of signals and may not be the actual portrayal of what occurs when optical data signals of different polarizations or wavelengths are combined.

Figure 6:
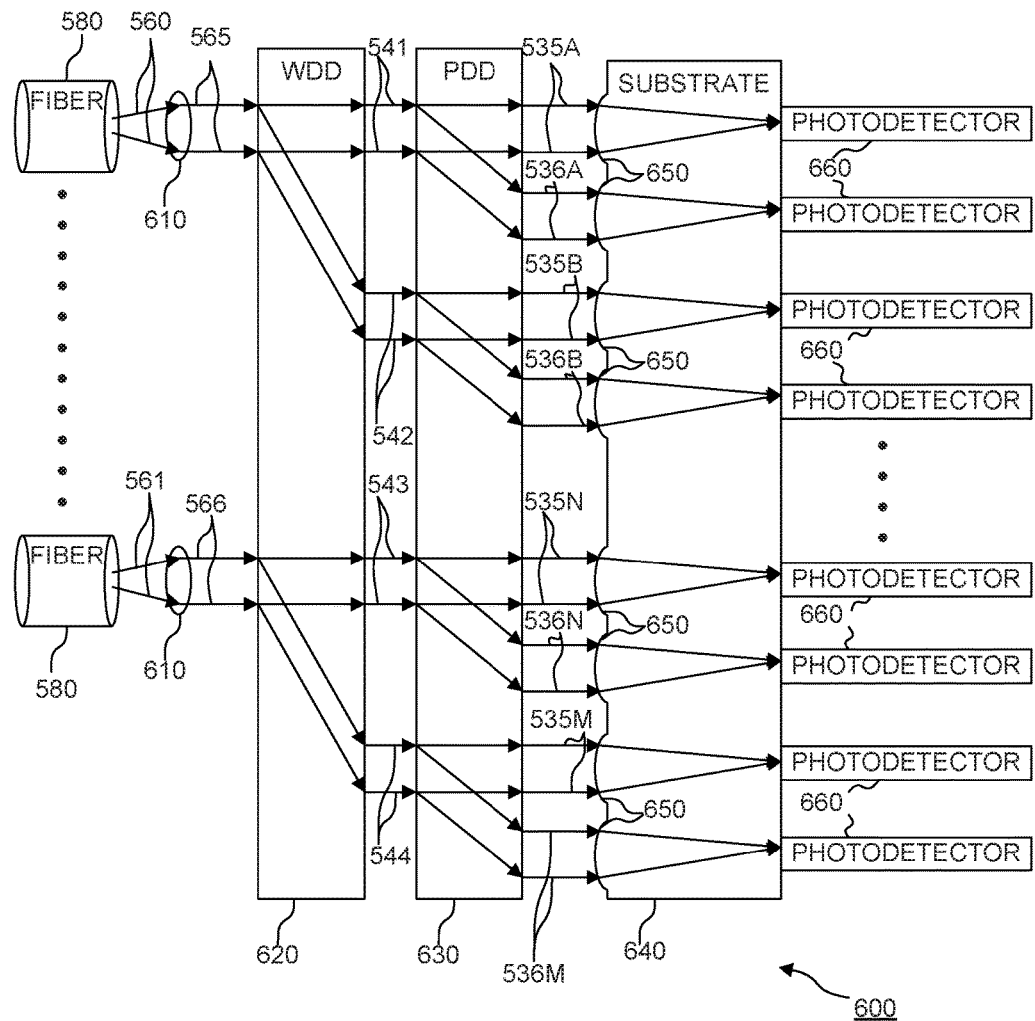
FIG. 6 is a block diagram of an example of an array of photodetectors, with a PDD, and a wavelength division demultiplexer (WDD)

FIG. 6 is a block diagram of an example of an array of photodetectors 660, with a PDD 630, and a WDD 620. FIG. 6 illustrates an example of a receiver 600 that receives optical data signals 560, 561 from system 500. The optical data signals 560, 561 may be sent over a fiber 580. In another example, the optical data signals 560, 561 may be sent over a fiber array. The fiber array may be arranged in any number of configurations. In an example, a lens 610 may collimate the optical data signal 560, 561 from the fiber 580. The collimated optical data signal 565, 566 may be sent to a WDD 620. The WDD 620 may separate the collimated optical data signal 565, 566 into optical data signals 541, 542, 543, 544 of varying wavelengths. These optical signals 541, 542, 543, 544 may be sent to a PDD 630. The PDD 630 separates the optical data signals 541, 542, 543, 544 of varying wavelengths into orthogonally polarized optical data signals 535, 536. Lenses 650, integrated with photodetectors 660, may focus the orthogonally polarized optical data signals 535, 536 onto the photodetectors 660. In another example, the lenses 650 are discrete and not integrated with the photodetectors 660. In an example, the photodetectors 660 convert the orthogonally polarized optical data signal 535, 536 into electrical signals. In another example, the photodetectors 660 are photodiodes or avalanche photodiodes.

Figure 7:
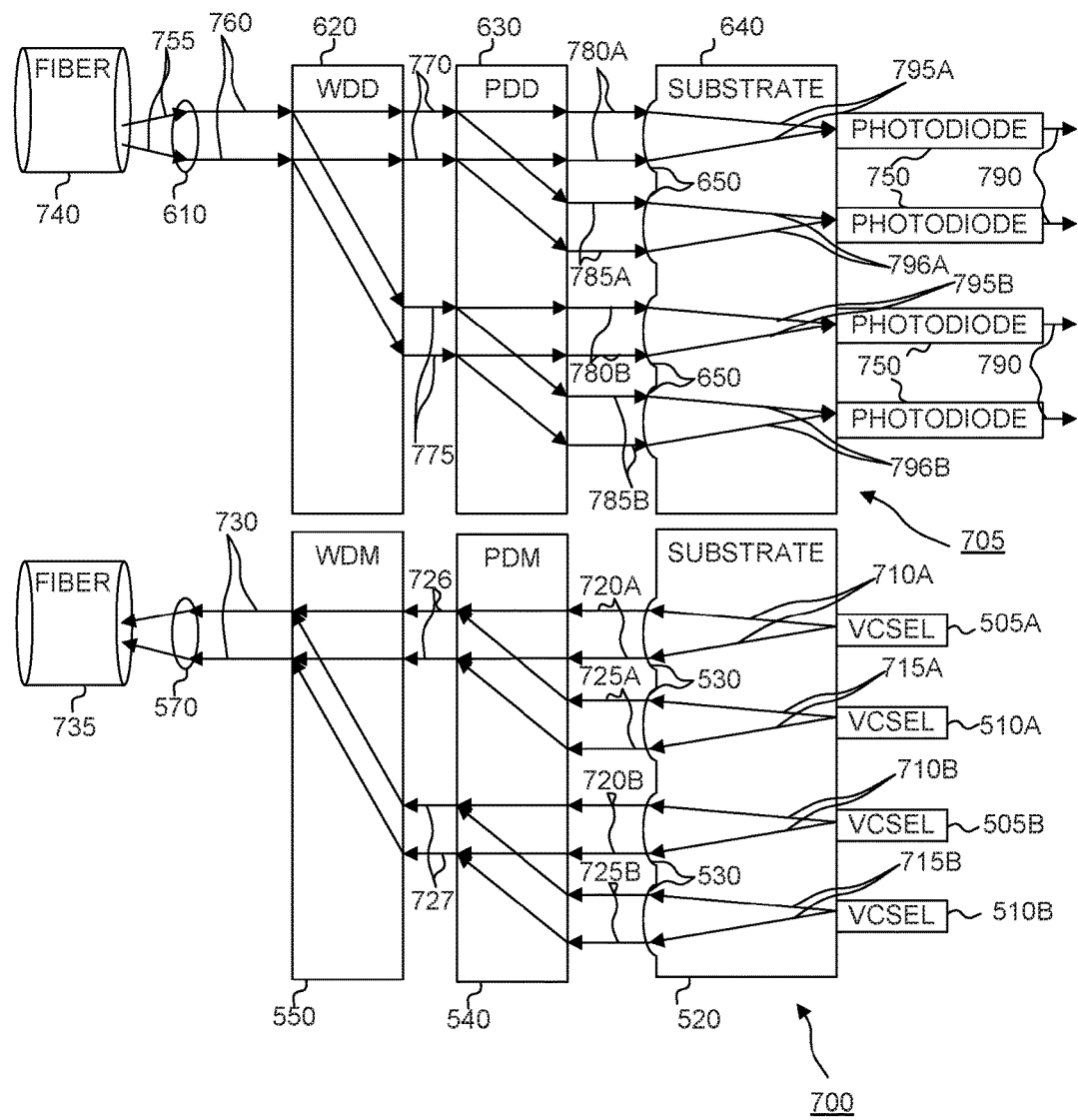
FIG. 7 is a block diagram of an example of an array of VCSELs and photodetectors disposed on separate substrates.

FIG. 7 is a block diagram of an example of an array of VCSELs 505, 510 and photodiodes 750 disposed on separate substrates 640, 520. In an example, system 100, system 200, system 500, or a similar system, may be situated next to a receiver such as receiver 300, receiver 600, or a similar receiver. In another example, system 100, system 200, system 500, or another similar system may be referred to as a transmitter. FIG. 7 illustrates an example of an adjacent transmitter 700 and receiver 705. In another example, the transmitter 700 and receiver 705 may be part of an optical transceiver. The transmitters 700 VCSELs 505, 510 may produce orthogonally polarized optical data signals 710, 715. Integrated lenses 530 may collimate the orthogonally polarized optical data signals 710, 715. The collimated polarized optical data signals 720, 725 may be sent to a PDM 540. The PDM 540 may combine the orthogonally polarized optical data signals 720, 725 into optical data signals 726, 727 of varying wavelengths. The optical data signals 726, 727 of varying wavelengths may be sent to a WDM 550. The WDM 550 may combine two optical data signals 726, 727 of varying wavelengths, as shown, or N optical data signals, where N may be more than two. A lens 570 may focus the combined optical data signal 730 onto a fiber 735. In an example, the fiber 735 is part of a fiber array. The fiber array may be multiple fibers contained in a cable. The fiber array may allow transmission and reception of optical data signals on the same system.

As noted, FIG. 7 also illustrates a receiver 705. In an example, the receiver 705 may contain photodiodes 750. In another example, the receiver may utilize different photodetectors. As illustrated in FIG. 7, the photodiodes 750 are disposed on a substrate 640 separate from the substrate 520 the VCSELs 505, 510 are disposed on. In an example, the fiber pitch may be around 250 microns. In another example, the wavelength of the optical data signals 70, 715 of the adjacent pairs of VCSELs 505, 510 may be different by equal to or less than 30 nanometers. In such examples, CWDM may be used to combine the optical data signals 726, 727. In other examples, the variation in wavelength may be more or less. In instances where the wavelength difference is less, DWDM may be utilized.

The receiver 705 in FIG. 7 may receive an optical data signal 755 over a fiber 740. A lens 610 may collimate the optical data signal 755 before it is sent to a WDD 620. As described above, the WDD may separate the collimated optical data signal 760 into optical data signals 770, 775 of varying wavelengths. Further, the optical data signals 770, 775 of varying wavelengths may be sent to a PDD 630. The PDD 630 may separate the optical data signals 770, 775 of varying wavelengths to orthogonally polarized pairs of optical data signals 780, 785 of varying wavelengths. Lenses 650 may focus the orthogonally polarized pairs of optical data signals 780, 785 of varying wavelengths onto photodiodes 750. The photodiodes 750 may convert the focused orthogonally polarized pairs of optical data signals 795, 796 of varying wavelengths into electrical signals 790.

Figure 8:
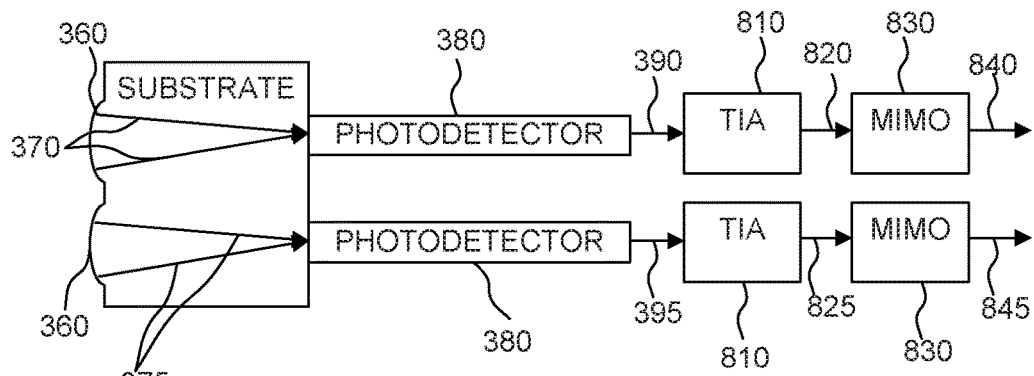
FIG. 8 is a block diagram of an example of photodetectors to send an electrical signal to a transimpedance amplifier (TIA) and multiple-in multiple-out (MIMO) matrix.

FIG. 8 is a block diagram of an example of photodetectors 380 to send an electrical signal 390 to a transimpedance amplifier (TIA) 810 and multiple-in multiple-out (MIMO) matrix 830. As described above, lenses 360 may focus orthogonally polarized optical data signals onto photodetectors 380. The photodetectors 380 may convert the focused orthogonally polarized optical data signals 370, 375 to electrical signals 390, 395. The TIA 810 may amplify the electrical signals 390, 395. The amplified electrical signals 820, 825 may not be the original electrical signals that modulated the VCSELs in the transmitter. During transmission of the optical data signal over the fiber, the optical data signal may be rotated. This may cause the optical data signal, once passed through the PDD, to separate into optical data signals of the wrong polarization. Stated another way, the polarization of the separated optical data signal may be rotated. When the optical data signals are converted into electrical signals 390, 395, the electrical signals 390, 395 may be different than the original electrical signals. The MIMO matrix 830, as shown in FIG. 8, may correct this issue. The MIMO matrix 830, using a training sequence, may correct the amplified electrical signals 820, 825. The MIMO matrix 830 may output the corrected electrical signals 840, 845.

Figure 9A:
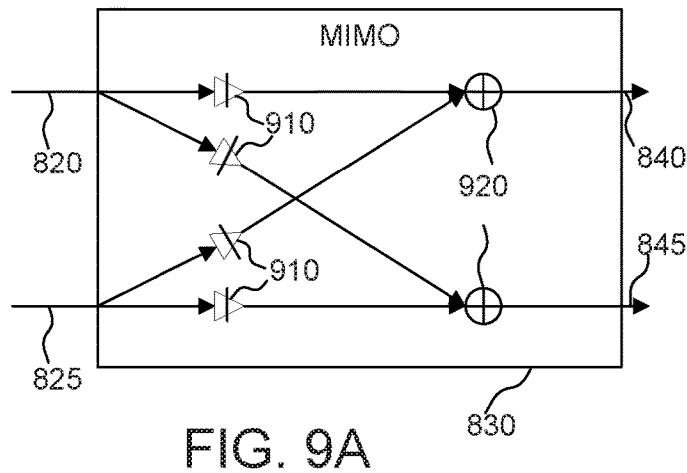
FIGS. 9A and 9B are block diagrams of an example of the MIMO matrix.
Figure 9B:
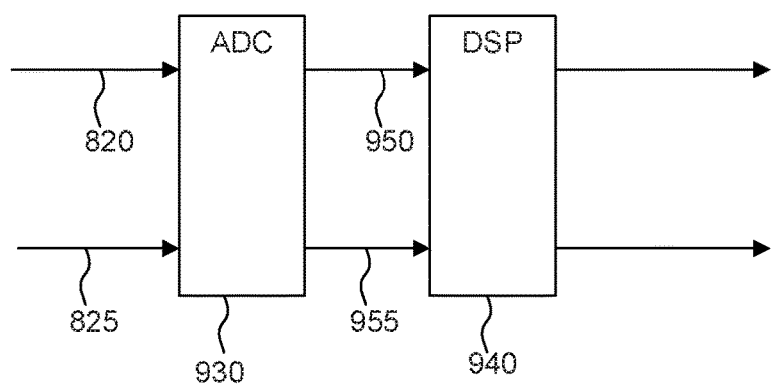

FIGS. 9A and 9B are block diagrams of an example of the MIMO matrix 830. FIG. 9A is an example of an analog solution of a MIMO matrix 830. The MIMO matrix 830 may include four variable gain amplifiers 910 and two summers 920. The MIMO matrix 830 effectively represents a two by two multiplication matrix. The following equation may represent the MIMO matrix's functionality:

$$\begin{pmatrix} S_x \\ S_y \end{pmatrix} = \begin{pmatrix} A & B \\ C & D \end{pmatrix} \begin{pmatrix} S_a \\ S_b \end{pmatrix}$$

Based on the equation above, $S_x=(S_a*A)+(S_b*B)$ and $S_y=(S_a*C)+(S_b*D)$. In such examples, $S_a$ is the input amplified electrical signal 820 and $S_b$ is the other input amplified electrical signal 825. Further, A, B, C, and D are co-efficients that may be variable based on a training sequence or pattern. These coefficients may be varied until the correct electrical signals 840, 845 are achieved. Once the correct electrical signals 840, 845 are achieved, in an example, the coefficients may be periodically updated through training sequences and then set for data transmission. In another example, the coefficients are varied based on feedback signals. In FIG. 9B, the MIMO matrix 830 may be implemented using a digital signal processor (DSP) 940. In such examples, an analog to digital converter (ADC) 930 may convert the analog amplified electrical signals 820, 825 to digital signals 950, 955. A similar training sequence or pattern may execute in the DSP 940 to obtain the correct digital signals.

Figure 10:
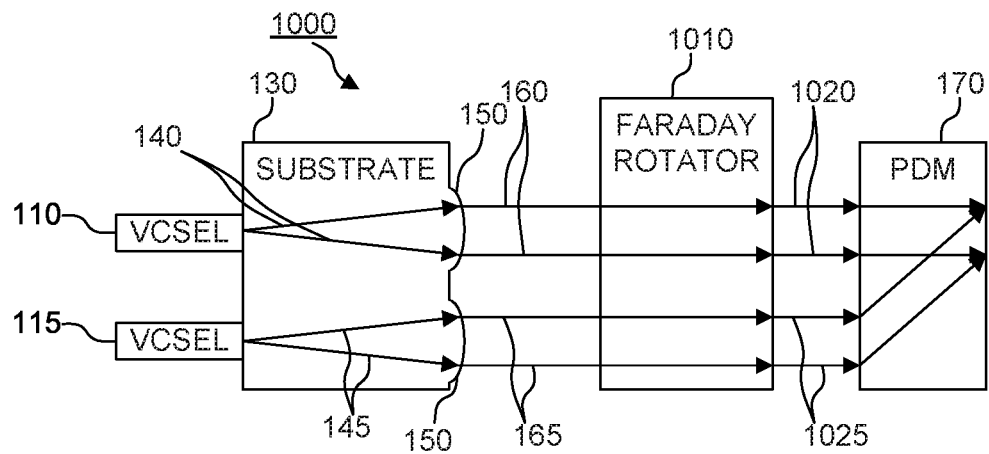
FIG. 10 is a block diagram of an example system including two orthogonally polarized vertical-cavity surface-emitting lasers (VCSELs) with integrated lenses, a Faraday rotator, and a polarization division multiplexer (PDM)

FIG. 10 is a block diagram of an example system 1000 including two orthogonally polarized VCSELs 110, 115 with integrated lenses 150, a Faraday rotator 1010, and a PDM 170. As described above, VCSEL 110, with an integrated polarization locking structure, may produce a polarized optical data signal 140 and VCSEL 115, with an integrated polarization locking structure, may produce an orthogonally polarized optical data signal 145. As described above, the integrated lenses 150 may collimate the polarized optical data signal 140 and orthogonally polarized optical signal 145, producing a collimated polarized optical data signal 160 and a collimated orthogonally polarized optical data signal 165. In an example, the system 1000 may include a Faraday rotator 1010. The Faraday rotator 1010 may be disposed between the lenses 150 and the PDM 170 of the system 1000. In an example, the Faraday rotator 1010 may be a non-reciprocal Faraday polarization rotator. In an example, the Faraday rotator 1010 may rotate a linearly polarized optical data signal. In an example, when a polarized optical data signal (such as the collimated polarized optical data signal 160 or the collimated orthogonally polarized optical data signal 165) passes through the Faraday rotator 1010, the Faraday rotator 1010 may rotate or shift the polarized optical data signal. In an example, the Faraday rotator 1010 may rotate the polarized optical data signal by 45 degrees. In another example, the Faraday rotator 1010 may rotate the polarized optical signal by a different degree.

As described above, the Faraday rotator 1010 may rotate a polarized optical data signal. In an example, the system 1000 may pass the rotated collimated polarized optical data signal 1020 and the rotated collimated orthogonally polarized optical data signal 1025 to a PDM 170. The PDM 170 may combine the rotated collimated polarized optical data signal 1020 and the rotated collimated orthogonally polarized optical data signal 1025. The system 1000 may include lenses to focus the optical data signal produced by the PDM 170 onto a fiber. In an example, some portion of the optical data signal may be reflected back into system 1000. The Faraday rotator 1010 may rotate the reflected optical data signal. In such examples, the rotated and reflected polarized optical data signal may not impact the system 1000. For example, a VCSEL (e.g., VCSEL 110 and/or VCSEL 115) may produce a polarized optical data signal (e.g., polarized optical signal 140 and/or orthogonally polarized optical signal 145). The Faraday rotator (e.g., Faraday rotator 1010) may rotate the polarized optical data signal (e.g., polarized optical signal 140 and/or orthogonally polarized optical signal 145) by 45 degrees. In an example a portion of the rotated polarized optical data signal is reflected back to the VCSEL (e.g., VCSEL 110 and/or VCSEL 115). In such examples, the Faraday rotator (e.g., Faraday rotator 1010) may rotate the reflected, and already rotated, polarized optical data signal another 45 degrees. Thus the reflected polarized optical signal may be orthogonal to the polarized optical signal (e.g., polarized optical signal 140 and/or orthogonally polarized optical signal 145) produced by the VCSEL (e.g., VCSEL 110 and/or VCSEL 115). In such an example, the impact of a reflected polarized optical data signal may be negligible. Thus the Faraday rotator (e.g., Faraday rotator 1010) may reduce noise (such as relative intensity noise) in the system (e.g., system 1000).

In another example, a similar system (for example system 100, system 200, receiver 300, system 500, receiver 600, transmitter 700, and receiver 705) may include a Faraday rotator. As stated above, a transmitter (such as transmitter 700) may include the Faraday rotator. In such examples, the Faraday rotator may be disposed between lenses (such as lenses 530) and a PDM (such as PDM 540). As stated above, a receiver (such as receiver 600) may include a Faraday rotator. In such examples, the Faraday rotator may be disposed between a PDD (such as PDD 630) and lenses (such as lenses 650). In either example (as in the example of a transmitter or receiver including a rotator), the Faraday rotator may perform the same functionality as described above. In another example, the Faraday rotator may be disposed in a system similar to the system represented in FIG. 7. In such examples, the Faraday rotator may span the length of the transmitter 700 and the receiver 705 combined. Stated another way, the Faraday rotator 1010 may be a single Faraday rotator that is as long as both the transmitter 700 and receiver 705.

In another example, a pair of polarization locked VCSELs, a Faraday rotator, and a PDM may be an isolator. The isolator may include a PDD as well. The isolator may be one component. The isolator may provide the functionality, as described above, of the pair of polarization locked VCSELs, the Faraday rotator, and a PDM.

A process 1100, implementable in system 100 and other systems, is flow charted in FIG. 10. At block 1101, in response to an electrical signal, a first VCSEL 110 may produce a polarized optical data signal 140. Further, the VCSEL 140 may include an integrated HCG. In an example, the HCG uses a specific pattern of grating. In such examples, when an optical data signal passes through the integrated HCG, the result is a polarized optical data signal 140. In an example, the HCG may be in any orientation.

At block 1102, in response to a second electrical signal, a second VCSEL 115 may produce an orthogonally polarized optical data signal 145. Further, the second VCSEL 115 may include a second HCG. In an example, the second HCG uses a specific pattern of grating which is orthogonal to the pattern of grating on the first HCG. The second HCG may also vary in another aspect. As described above, that aspect may include the period of the gratings, the pitch of the gratings, or the thickness of the gratings. The slight variations in the grating may cause the optical data signal that passes through the grating to be of a different wavelength than the first optical data signal 140. In another example, the pattern of grating in the second HCG is orthogonal to the pattern of grating in the first HCG. The orthogonal pattern of grating may cause the optical data signal passing through the grating to become orthogonally polarized.

At block 1103, a first lens 150 may collimate the polarized optical data signal 140. This lens 150 may be placed at specific distance from the VCSEL 110 to properly collimate the optical data signal 140. In another example, the lens 150 is integrated with the VCSEL 110. In such examples, the lens 150 would be disposed opposite the VCSEL 110 on a substrate 130.

At block 1104, a second lens 150 may collimate the orthogonally polarized optical data signal 145. This lens 150 may be placed at specific distance from the VCSEL 115 to properly collimate the optical data signal 145. In another example, the second lens 150 is integrated with the VCSEL 115. In such examples, the second lens 150 would be disposed opposite the VCSEL 115 on a substrate 130.

At block 1105, a PDM 170 may combine the collimated polarized optical data signal 160 and the collimated orthogonally polarized optical data signal 165. The PDM 170 combines polarized optical data signals to create an optical data signal. Other types of multiplexers may be utilized in other scenarios.

The system 100 may be considered a transmitter. Once the transmitter creates the combined optical data signal 180, the transmitter, using a lens 190, may focus the combined optical data signal 185 onto a fiber 195. The optical data signal 185 may then be transmitted to a receiver. The receiver may, upon reception of an optical data signal 185, collimate the received optical data signal. A PDD may split the collimated optical data signal into separate polarized optical data signals. The separated optical data signals may be focused onto photodiodes. The photodiodes may convert the optical data signals into electrical signals. The electrical data signals may be amplified via a transimpedance amplifier. The electrical data signals may be corrected via the use of MIMO matrix with a training sequence or pattern, as described above.

Although the flow diagram of FIG. 11 shows a specific order of execution, the order of execution may differ from that which is depicted. For example, the order of execution of two or more blocks or arrows may be scrambled relative to the order shown. Also, two or more blocks shown in succession may be executed concurrently or with partial concurrence. All such variations are within the scope of the present disclosure.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be examples. Structure and acts described herein are replaceable by equivalents, which perform the same function, even if the structure or acts are different, as known in the art. Therefore, the scope of the present disclosure is limited only by the elements and limitations as used in the claims.

What is claimed is:

1. A system comprising:
   a first vertical cavity surface emitting laser (VCSEL) including a first integrated polarization locking structure to produce a polarized optical data signal;
   a second VCSEL including a second integrated polarization locking structure, the second integrated polarization locking structure orthogonal to the first integrated polarization locking structure, to produce an orthogonally polarized optical data signal;
   lenses disposed on a substrate opposite the first VCSEL to collimate the polarized optical data signal and opposite the second VCSEL to collimate the orthogonally polarized optical data signal; and
a polarization division multiplexer to combine the first collimated polarized optical data signal and second collimated orthogonally polarized optical data signal, wherein a Faraday rotator, to rotate the polarized optical data signal and orthogonally polarized optical data signal, is disposed between the lenses and the polarization division multiplexer.

2. The system of claim 1, wherein a lens focuses the optical data signal from the polarization division multiplexer onto a fiber, the fiber connected to a receiver, the receiver comprising:
a lens to collimate a received optical data signal;
a polarization division demultiplexer to split the optical data signal into the first collimated polarized optical data signal and second collimated orthogonally polarized optical data signal;
a first photodetector and a second photodetector attached to a second substrate, wherein the first photodetector and second photodetector are disposed on the second substrate; and
a first receiving lens opposite the first photodetector and a second receiving lens opposite the second photodetector, wherein the first receiving lens focuses the first collimated polarized optical data signal onto the first photodetector and the second receiving lens focuses the second collimated orthogonally polarized optical data signal onto the second photodetector.

3. The system of claim 2, wherein the first photodetector converts the first collimated polarized optical data signal to a first electrical signal and the second photodetector converts the second collimated orthogonally polarized optical data signal to a second electrical signal.

4. The system of claim 3, the receiver further comprising:
a trans-impedance amplifier to amplify the first electrical signal and a second trans-impedance amplifier to amplify the second electrical signal.

5. The system of claim 4, the receiver further comprising:
a two by two multiple in multiple out (MIMO) matrix, wherein the two by two MIMO matrix receives the first electrical signal and the second electrical signal, comprising:
four variable gain amplifiers; and
two summers.

6. The system of claim 5, wherein feedback loops dynamically tune, with a training pattern, the amplitude of the four variable gain amplifiers.

7. The system of claim 4, the receiver further comprising:
an analog to digital converter to convert the first electrical signal to a first digital signal and the second electrical signal to a second digital signal; and
a digital signal processor to implement a two by two multiple in multiple out (MIMO) matrix, wherein the digital signal processor receives the first digital signal and the second digital signal.

8. The system of claim 2, wherein the system includes the receiver and the system sends and receives optical data signals over a fiber array.

9. The system of claim 8, wherein the VCSELs and the photodetectors are disposed on separate substrates.

10. The system of claim 1, wherein the polarized optical data signal is a different wavelength than the orthogonally polarized optical data signal.

11. The system of claim 1, wherein the first VCSEL and second VCSEL are disposed on the same substrate.

12. The system of claim 1, wherein the second integrated polarization locking structure includes gratings different than gratings of the first integrated polarization locking structure.

13. The system of claim 1, wherein the Faraday rotator rotates the polarized optical data signal and orthogonally polarized optical data signal by 45 degrees.

14. A system comprising:
a first vertical cavity surface emitting laser (VCSEL) including an integrated high contrast grating (HCG) comprising a first pattern of grating to produce a polarized optical data signal of a first wavelength;
a second VCSEL including a second integrated HCG comprising a second pattern of grating, the second pattern orthogonal to the first pattern, to produce an orthogonally polarized data signal of a second wavelength, wherein the second wavelength is less than or equal to 0.3 nanometers different than the first wavelength;
a third vertical cavity surface emitting laser (VCSEL) including a third integrated HCG comprising the first pattern of grating to produce a polarized optical data signal of a third wavelength;
a fourth VCSEL including a fourth integrated HCG comprising the second pattern of grating to produce an orthogonally polarized data signal of a fourth wavelength, wherein the fourth wavelength is less than or equal to 0.3 nanometers different than the third wavelength;
lenses placed opposite the first VCSEL, second VCSEL, third VCSEL, and fourth VCSEL to collimate the polarized optical data signals;
a polarization division multiplexer, wherein a Faraday rotator is disposed between the lenses and the polarization division multiplexer, to combine:
the first collimated polarized optical data signal of the first wavelength and second collimated orthogonally polarized optical data signal of the second wavelength;
the third collimated polarized optical data signal of the third wavelength and fourth collimated orthogonally polarized optical data signal of the fourth wavelength; and
a wavelength division multiplexer to combine the combined optical data signal of the first wavelength and second wavelength and the combined optical data signal of the third wavelength and fourth wavelength.

15. The system of claim 14, wherein the system includes an array of paired VCSELs.

16. The system of claim 15, wherein each pair of VCSELs produces optical data signals of a different wavelength than adjacent pairs of VCSELs.

17. The system of claim 14, wherein the first VCSEL and the second VCSEL are disposed on a substrate different than the third VCSEL and fourth VCSEL.

18. The system of claim 14, wherein the polarization of the polarized optical data signal of the first wavelength, the orthogonally polarized data signal of the second wavelength, the polarized optical data signal of the third wavelength, and the orthogonally polarized data signal of the fourth wavelength is locked.

19. The system of claim 14, wherein the Faraday rotator rotates, by 45 degrees, the polarized optical data signal of the first wavelength, the polarized optical data signal of the second wavelength, the polarized optical data signal of the third wavelength, and the polarized optical data signal of the fourth wavelength.

20. A method comprising:
in response to a first electrical signal, generating, with a first vertical cavity surface emitting laser (VCSEL) including a high contrast grating (HCG), a first polarized optical data signal;
in response to a second electrical signal generating, with a second VCSEL including an orthogonal HCG, a second polarized optical data signal,
wherein the second polarized optical data signal is orthogonal to the first polarized optical data signal,
wherein the first polarized optical data signal is a different wavelength than the second polarized optical data signal;
collimating, with a first lens integrated with the first VCSEL, the first polarized optical data signal;
collimating, with a second lens integrated with the second VCSEL, the second polarized optical data signal;
rotating, with a Faraday rotator, the first polarized optical data signal and the second polarized optical data signal; and
combining, with a polarization division multiplexer, a first rotated polarized optical data signal and second rotated polarized optical data signal into an optical data signal.

21. The method of claim 20, further comprising:
focusing, with a third lens, the optical data signal onto a fiber, wherein the fiber is connected to a receiver;
splitting, with a beam splitter, the optical data signal from the fiber into the first polarized optical data signal and the second optical data signal;
converting, with a first photodiode, the first polarized optical data signal into a first new electrical signal;
converting, with a second photodiode, the second polarized optical data signal into a second new electrical signal;
strengthening, with a first trans-impedance amplifier, the first new electrical signal;
strengthening, with a second trans-impedance amplifier, the second new electrical signal; and
determining, with a two by two MIMO, the first electrical signal and the second electrical signal based on the first new electrical signal, the second new electrical signal, and a training sequence.

* * * * *